(12) United States Patent
Minkler et al.

(10) Patent No.: US 9,234,932 B2
(45) Date of Patent: Jan. 12, 2016

(54) METHOD AND APPARATUS FOR MONITORING ION LENS CONNECTIONS

(71) Applicants: David E. Minkler, Campbell, CA (US); Michael G. Konicek, Santa Clara, CA (US)

(72) Inventors: David E. Minkler, Campbell, CA (US); Michael G. Konicek, Santa Clara, CA (US)

(73) Assignee: Thermo Finnigan LLC, San Jose, CA (US)

( * ) Notice: Subject to any disclaimer, the term of this patent is extended or adjusted under 35 U.S.C. 154(b) by 325 days.

(21) Appl. No.: 13/801,771

(22) Filed: Mar. 13, 2013

(65) Prior Publication Data

US 2014/0266232 A1    Sep. 18, 2014

(51) Int. Cl.
*H01J 49/00* (2006.01)
*G01R 31/02* (2006.01)
*H01J 49/06* (2006.01)

(52) U.S. Cl.
CPC .............. *G01R 31/026* (2013.01); *H01J 49/067* (2013.01); *H01J 49/0031* (2013.01)

(58) Field of Classification Search
USPC .......................................................... 250/282
See application file for complete search history.

(56) References Cited

U.S. PATENT DOCUMENTS

| | | | | |
|---|---|---|---|---|
| 4,688,133 | A * | 8/1987 | Freeman ................... | H02H 3/33 361/42 |
| 4,812,649 | A * | 3/1989 | Nakagawa ............. | H01J 49/022 250/281 |
| 7,282,721 | B2 * | 10/2007 | Sullivan ................ | H01J 37/244 250/396 R |
| 7,528,609 | B2 * | 5/2009 | Savicki, Jr. .......... | H01R 25/003 324/508 |

* cited by examiner

*Primary Examiner* — Phillip A Johnston
(74) *Attorney, Agent, or Firm* — Charles B. Katz (57) ABSTRACT

This technology is directed to a method and apparatus for monitoring or testing defects associated with an ion lens connected within a mass spectrometer. In some implementations, the testing mechanism monitors a connection of one or more ion lenses configured in the mass spectrometer to determine if voltage is effectively applied to the ion lens. The testing circuit of the present technology includes at least one Zener diode added to the voltage divider and monitoring a change in slope of the applied voltage versus the voltage at the read-back circuit. The change in slope may be easily measured.

16 Claims, 6 Drawing Sheets

Index of Values
Lens-Supply Resistor 4000 Ohms
Lens Resistor         4000 Ohms
Diode Voltage         250 Volts

| Lens Voltage Supply | Voltage at Diode | Read-back Voltage Measurement (Connected) | Read-back Voltage Measurement (Not Connected) |
|---|---|---|---|
| -300 | -250 | -275 | -300 |
| -280 | -250 | -265 | -280 |
| -260 | -250 | -255 | -260 |
| -240 | -240 | -240 | -240 |
| -220 | -220 | -220 | -220 |
| -200 | -200 | -200 | -200 |
| -180 | -180 | -180 | -180 |
| -160 | -160 | -160 | -160 |
| -140 | -140 | -140 | -140 |
| -120 | -120 | -120 | -120 |
| -100 | -100 | -100 | -100 |
| -80 | -80 | -80 | -80 |
| -60 | -60 | -60 | -60 |
| -40 | -40 | -40 | -40 |
| -20 | -20 | -20 | -20 |
| 0 | 0 | 0 | 0 |
| 20 | 20 | 20 | 20 |
| 40 | 40 | 40 | 40 |
| 60 | 60 | 60 | 60 |
| 80 | 80 | 80 | 80 |
| 100 | 100 | 100 | 100 |
| 120 | 120 | 120 | 120 |
| 140 | 140 | 140 | 140 |
| 160 | 160 | 160 | 160 |
| 180 | 180 | 180 | 180 |
| 200 | 200 | 200 | 200 |
| 220 | 220 | 220 | 220 |
| 240 | 240 | 240 | 240 |
| 260 | 250 | 255 | 260 |
| 280 | 250 | 265 | 280 |
| 300 | 250 | 275 | 300 |

METHOD AND APPARATUS FOR MONITORING ION LENS CONNECTIONS

FIELD OF THE INVENTION

The present technology relates generally to ion lenses employed in mass spectrometers, and more particularly to testing and monitoring techniques to determine if an ion lens is properly connected.

BACKGROUND OF THE INVENTION

Mass spectrometers typically utilize multiple ion lenses for extraction, guiding, and focusing of ions along a desired path. Generally described, an ion lens consists of one or more electrodes to which a static or dynamic potential is applied, thereby establishing an electrical field that influences the direction of ion movement. In order to ensure that a mass spectrometer is operating correctly, or to diagnose the cause of malfunction, it is desirable to provide verification to the operator that the ion lenses are receiving the correct potential. In mass spectrometer systems that constitute the prior art, it is known to employ a read-back circuit to confirm that an ion lens driver is operating correctly, and to sense shorts to ground or to another ion lens. However, such read-back circuits are unable to determine if the voltage produced by the driver does not reach the corresponding ion lens, which is clearly desirable to insure that the ion lens is working properly. One current method used to make this determination is by configuring an additional wire from the ion lens back to the read-back circuit. Apart from being a cumbersome and costly solution, this technique is undesirable, as it requires additional wiring inserted through a manifold wall via feed-through pins, which introduces more hardware and increases cost.

In view of the foregoing discussion, it would be advantageous to develop an effective solution for determining whether an ion lens located within a mass spectrometer is receiving the correct potential while avoiding the need to add feed-throughs or otherwise increase complexity and cost.

SUMMARY

In one innovative aspect, the present technology includes an apparatus for monitoring defects in a connection of at least one ion lens within a mass spectrometer, comprising: an ion lens voltage supply for applying voltage to the at least one ion lens within the mass spectrometer; a read-back circuit connected to the at least one ion lens within the mass spectrometer; and a test circuit including at least one non-linear conduction device, such as a Zener diode, configured between the ion lens voltage supply and a reference point maintained at a designated voltage (which may be ground or a non-zero fixed value) for indicating a reading reflecting a reduction in voltage when the non-linear conduction device begins conducting, the reading reflecting the reduction in voltage indicating a change in slope of a voltage applied by the ion lens voltage supply versus a voltage at the read-back circuit.

In general, another innovative aspect of the present disclosure includes a method, for applying voltage across the at least one ion lens and a non-linear conduction device to a reference point maintained at a designated voltage (e.g., ground); monitoring the voltage at a read-back circuit between an ion lens voltage supply and the at least one ion lens; determining a change in voltage slope at the read-back circuit in relation to the ion lens voltage supply; and determining whether the at least one ion lens is connected based on the change in voltage slope at the read-back circuit in relation to the ion lens voltage supply.

These and other implementations may each optionally include one or more of the following features. For instance, the operations further include one or more of: applying the voltage across a first resistor to the reference point; applying the voltage across a second resistor to the reference point; and applying the voltage across an additional non-linear conduction device to the ground. For instance, the features include test configurations including either a single Zener diode or two Zener diodes that are configured back-to-back to measure a reduction in voltage when either one or both Zener diodes start conducting.

The systems and methods disclosed provide a number of advantages relative to prior art approaches, including providing the ability to directly determine the potential applied to an ion lens without requiring an additional signal line from the ion lens to the read-back circuit.

BRIEF DESCRIPTION OF THE DRAWINGS

The present disclosure is illustrated by way of example, and not by way of limitation, in the figures of the accompanying drawings, in which like reference numerals are used to refer to similar elements.

DETAILED DESCRIPTION OF EMBODIMENTS

In some embodiments, this technology comprises a method and apparatus for monitoring or testing defects in an ion lens connected within a mass spectrometer. Specifically, this technology comprises a method and test apparatus for monitoring voltage at a read-back circuit and determining whether an ion lens is properly connected within a mass spectrometer, based on the voltage reading observed at the read-back circuit.

In the following description, for purposes of explanation, numerous specific details are indicated in order to provide a thorough understanding of the technology described. It should be apparent, however, to one skilled in the art, that this technology can be practiced without these specific details. In other instances, structures and devices are shown in block diagram form in order to avoid obscuring the technology. For example, the present technology is described with some embodiments below with reference to particular hardware. Moreover, the present technology is described below primarily in the context of determining defects in a single ion lens connected within a mass spectrometer; however, those skilled in the art should understand that the present technology applies to any type of electrical connection using one or more ion lenses.

Reference in the specification to "one embodiment," "an embodiment," or "some embodiments," means simply that one or more particular features, structures, or characteristics described in connection with the one or more embodiments is included in at least one or more embodiments that are described. The appearances of the phrase "in one embodiment" in various places in the specification are not necessarily all referring to the same embodiment. An example embodiment of the testing mechanism is outlined in the description below.

Figure 1:
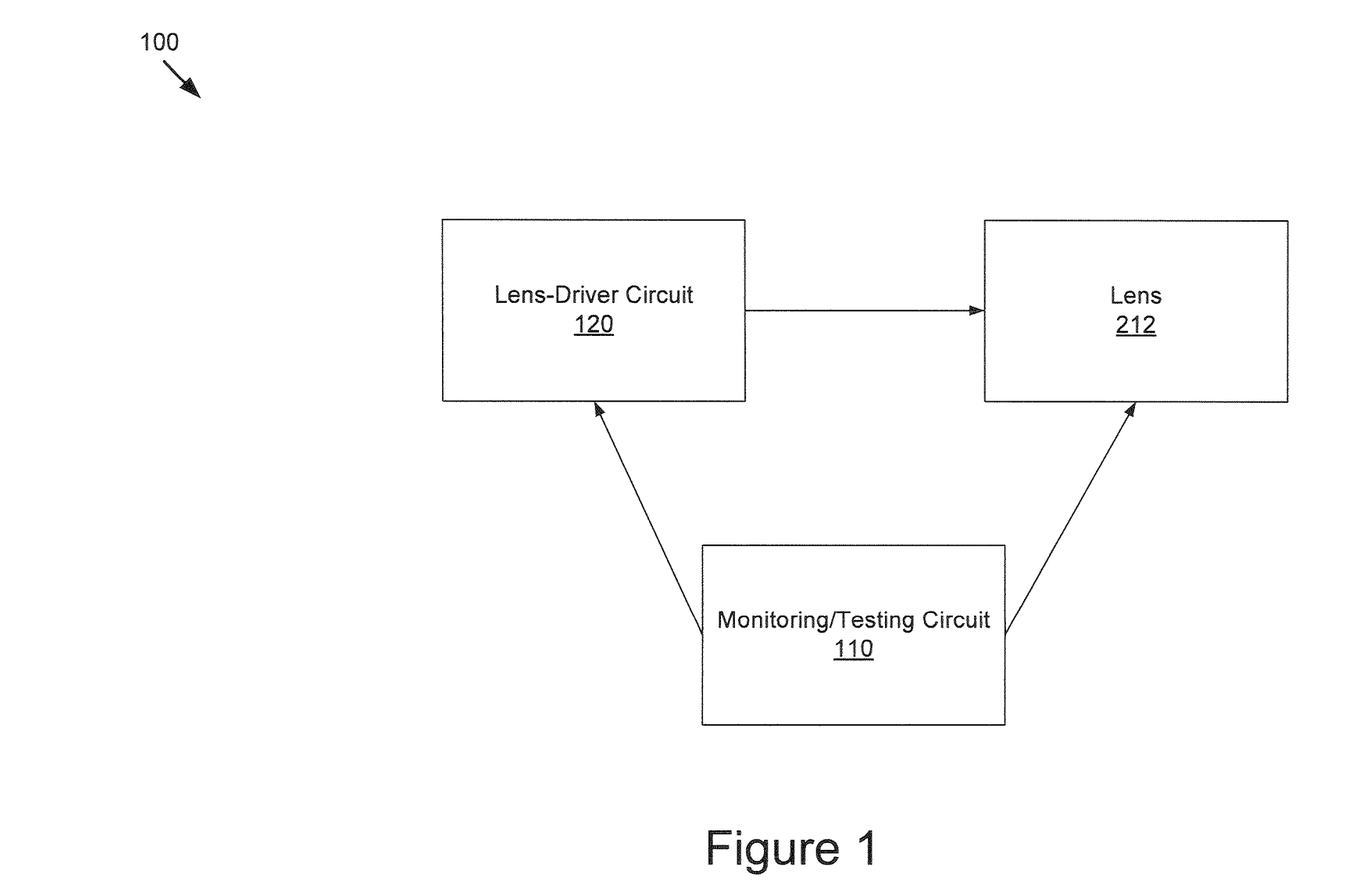
FIG. 1 is a high-level block diagram illustrating an illustrative embodiment of an ion lens-driver circuit driving an ion lens with a monitoring circuit coupled to test to determine the status of an ion lens connection.

FIG. 1 is a high-level block diagram illustrating a testing mechanism indicated generally by reference numeral 100 including an ion lens-driver circuit 120 configured to drive an ion lens 212. The testing mechanism includes a monitoring/testing circuit 110, which may be used to monitor the status of an ion lens connection, to not only determine if an ion lens is properly connected, but that a voltage applied to the ion lens 212, effectively reaches the ion lens 212. Although only a single ion lens is shown, the same technique may be used to monitor a plurality of ion lenses configured within a mass spectrometer. It is noted that ion lens 212 may comprise any known type and configuration of ion lens utilized in a mass spectrometer for guiding and focusing of ions, including (without limitation) an electrostatic plate ion lens, tube ion lens, chicane ion lens or Einzel ion lens. Ion lens 212 is typically located within a chamber of the mass spectrometer operated at vacuum pressure.

Figure 2A:
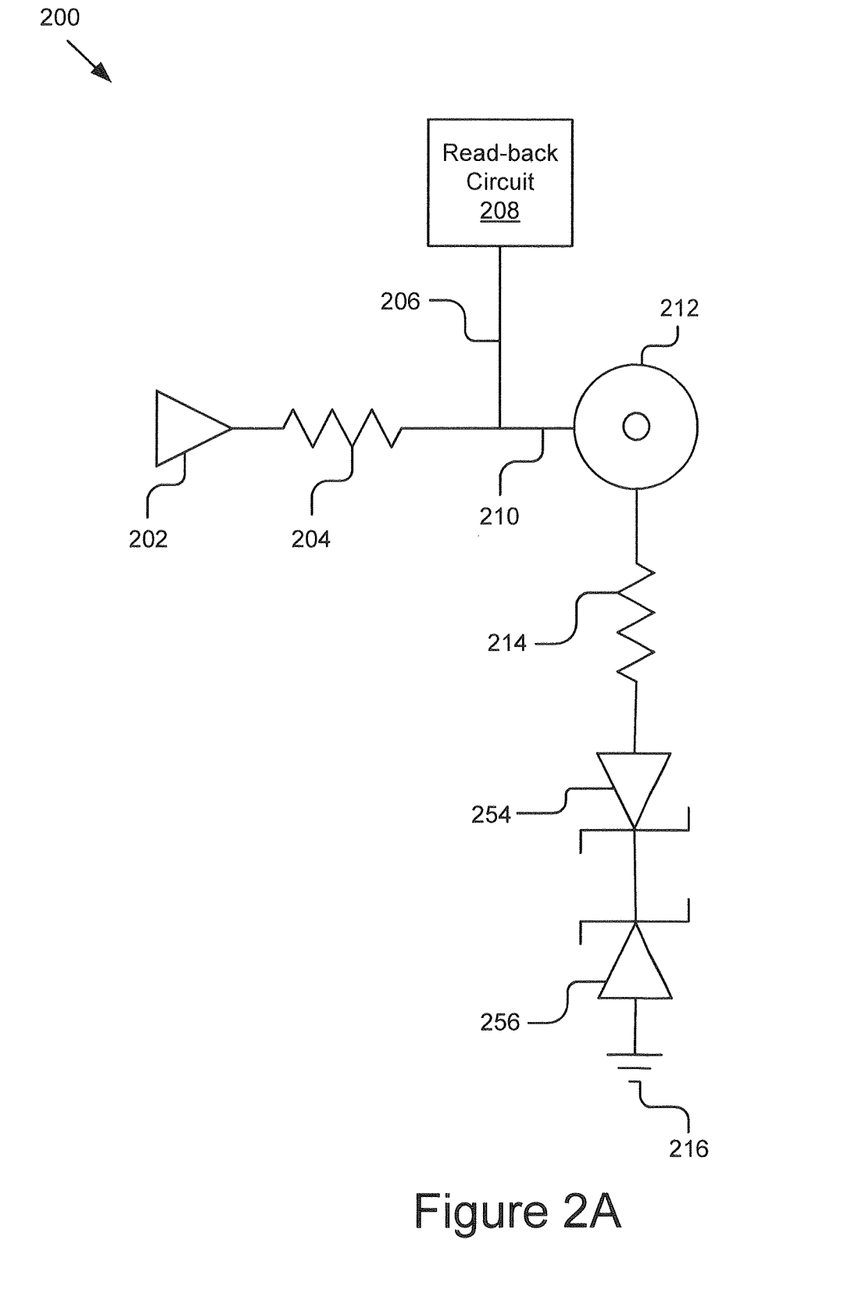
FIG. 2A is a circuit diagram illustrating the hardware components in the monitoring circuit shown in FIG. 1.

FIG. 2A is a circuit diagram indicated generally by reference numeral 200 illustrating the hardware components of the monitoring/testing circuit 110 shown in FIG. 1. In an example implementation, the monitoring circuit 110 includes an ion lens voltage supply 202 for applying voltage to the ion lens 212. The ion lens voltage supply 202 is connected to the ion lens 212, via a resistor 204 and a signal line 210. A read-back circuit 208 is configured between the resistor 204 and the ion lens 212. The read-back circuit 208 is connected to the signal line 210 between the resistor 204 and the ion lens 212, via a signal line 206. The ion lens 212, on its other side, is also connected to a resistor 214. A configuration including two Zener diodes, a first Zener diode 254, and a second Zener diode 256, is connected between the resistor 214 and reference point 216, which may be connected to ground or, alternatively, may be maintained at a reference voltage supplied by optional source 218, illustrated with broken lines. Zener diodes 254 and 256 can be connected either cathode-to-cathode or anode-to-anode. While the monitor circuits depicted and described herein incorporate Zener diodes, other types of non-linear devices (i.e., devices that exhibit desired non-linear current conduction properties), such as gas discharge tubes, may be substituted for the Zener diodes.

Figure 2B:
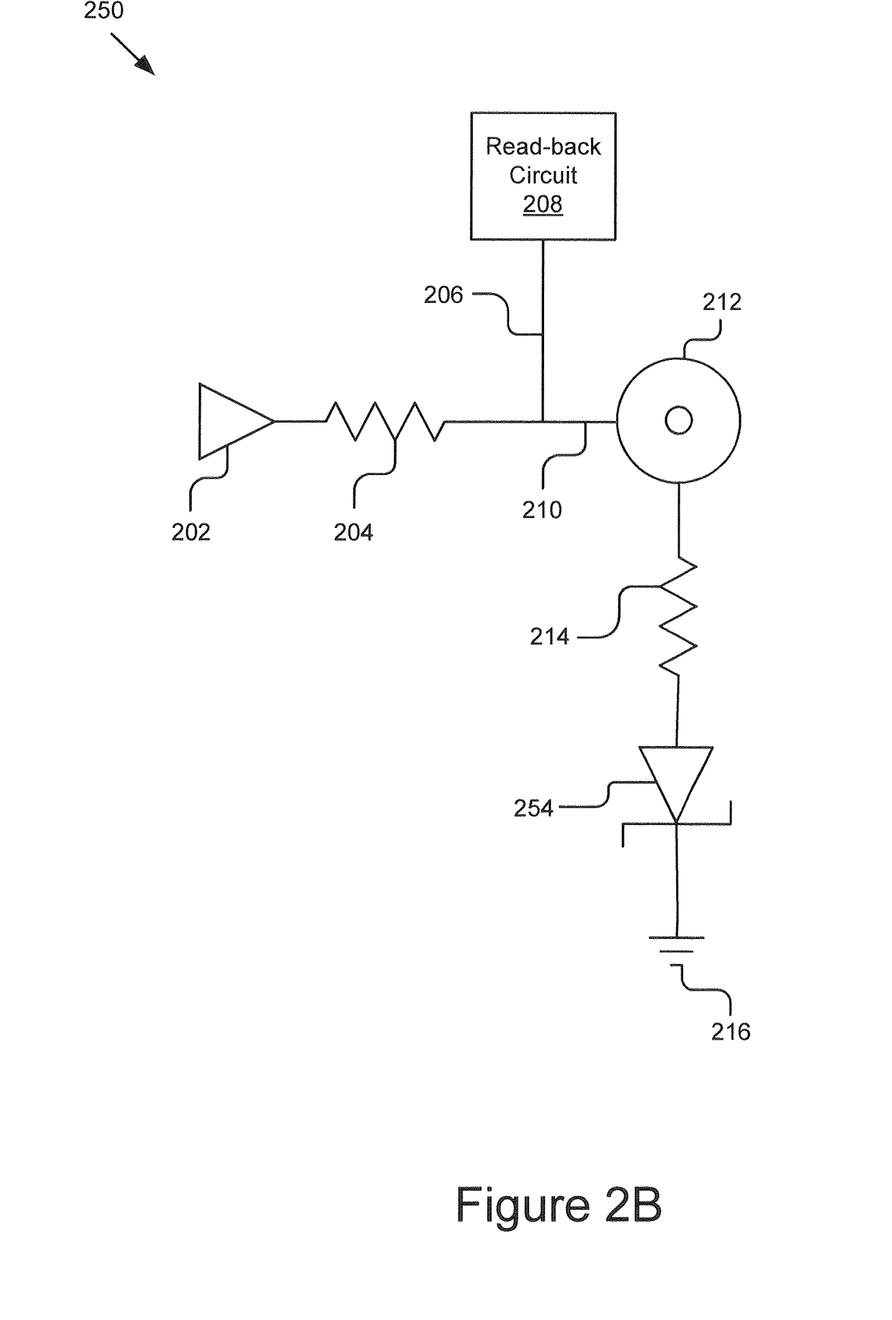
FIG. 2B is a circuit diagram illustrating the hardware components in the monitoring circuit shown in FIG. 1.

FIG. 2B is a circuit diagram indicated generally by reference numeral 250 illustrating the hardware components of the monitoring/testing circuit 110 shown in FIG. 1. In an example implementation, the monitoring circuit 110 includes an ion lens voltage supply 202 for applying voltage to the ion lens 212. The ion lens voltage supply 202 is connected to the ion lens 212, via a resistor 204 and a signal line 210. A read-back circuit 208 is configured between the resistor 204 and the ion lens 212. The read-back circuit 208 is connected to the signal line 210 between the resistor 204 and the ion lens 212, via a signal line 206. The ion lens 212, on its other side, is also connected to a resistor 214. A configuration including one Zener diode, a Zener diode 254, is connected between the resistor 214 and ground indicated by reference numeral 216.

In some implementations, a predetermined reference voltage (non-zero) may be either available or applied by optional source 218. In other implementations, other types of non-linear devices configured to conduct current above a specified voltage, for example, a gas discharge tube, may be used.

This test mechanism with the diode arrangement advantageously reads the response at the read-back circuit, when the diode is conducting and not conducting. In the event there is no change in slope when the diode is expected to conduct, a determination is easily made that the ion lens 212 is not connected. In addition, with this configuration, the read-back circuit self-calibrates itself, as a result of which the reading and determinations are accurate. Moreover, the read-back circuit 208 may measure the voltage applied to the ion lens 212 to determine its connectivity within any mass spectrometer. Advantageously, connectivity of an ion lens is determined without requiring additional signal lines or wires, which offers a simple yet elegant solution for testing connection defects at a component level in a mass spectrometer.

Furthermore, this test circuit design minimizes the impact of undesirable features. For instance, by using a configuration of back-to-back Zener diodes, added to the voltage divider, the reduction in voltage only occurs when one of the Zener diodes starts conducting. A proper connection of the ion lens 212 may be observed by noting a change in the slope of the applied voltage versus the read-back voltage. A change in slope is easier to measure than an absolute slope, so the accuracy of the read-back circuit itself is less critical.

Figure 3:
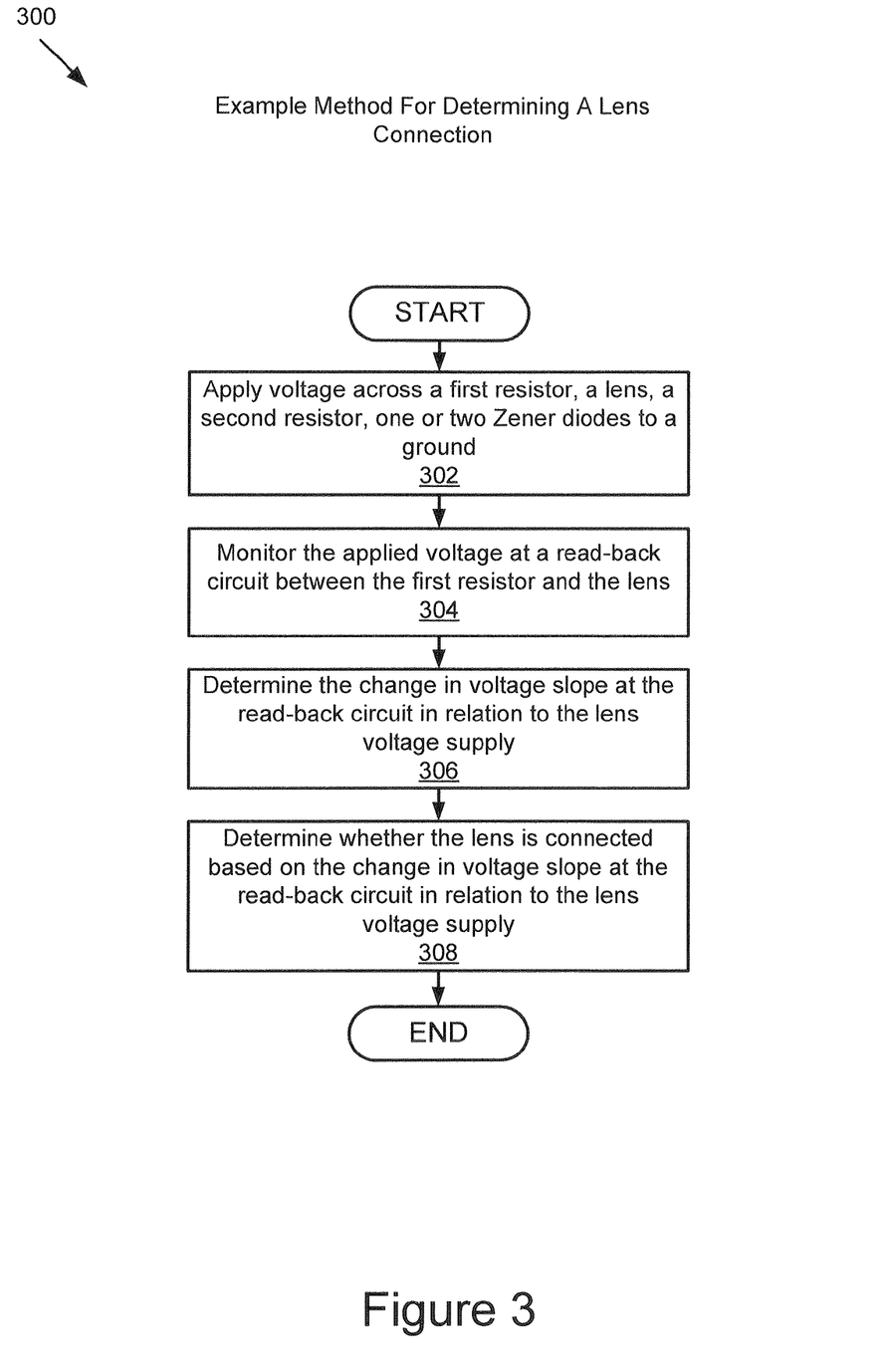
FIG. 3 is a flow chart illustrating an example method for monitoring the status of a connection to an ion lens located within a mass spectrometer.

FIG. 3 is a flow chart illustrating an example general method indicated by reference numeral 300 for testing the status of an ion lens connection. In some implementations, the method 300 includes one or more operations of block 301, to initiate or begin a test to check the status of a connection. For example, in some implementations tests may be continuously performed to determine the status of an ion lens connection. In other implementations, to determine the status of an ion lens connection, tests may be defined at regular intervals, and/or upon the occurrence of certain defined events. In yet other implementations, a test may be triggered by an event or user action, for example, when an instrument (spectrometer) is either started, calibrated, or the like. In the method 300 illustrated, one or more operations of block 302, may apply a voltage across the monitoring/testing circuit 110 including, the first resistor 204, the ion lens 212, the second resistor 214, and one or two Zener diodes 254 and 256 connected to ground 216 (or an applied or available non-zero voltage indicated at 218). The method 300 proceeds to the next block 304, at which stage, the method 300 includes one or more operations for monitoring the applied voltage at a read-back circuit (for example, read-back circuit 208) connected between the first resistor 204 and the ion lens 212. The method 300 proceeds to the next block 306, at which stage, the method 300 determines the change in voltage slope at the read-back circuit 208 in relation to the ion lens voltage supply 202 (provided by the ion lens-driver circuit 120 in FIG. 1). The method 300 proceeds to the next block 308, at which stage, the method 300 includes one or more operations for determining whether the ion lens 212 is connected, based on determining the change in voltage slope at the read-back circuit 208 in relation to the ion lens voltage supply 202. The method 300 proceeds to the next block 310, at which stage, the method includes one or more operations for displaying test results to a user or an operator of the mass spectrometer, via an appropriate user interface mechanism. In some implementations, the method 300 can be conducted at any time that the mass spectrometer is not transmitting ions past ion lens 212. This could be at initial startup, between samples analyses, between individual scans, or when requested by the operator or user. The results determined after running the method 300 can be recorded in a log file or data base, and displayed to the user through a graphical user interface or with indicator lights which may be included as part of the mass spectrometer.

Figure 4:
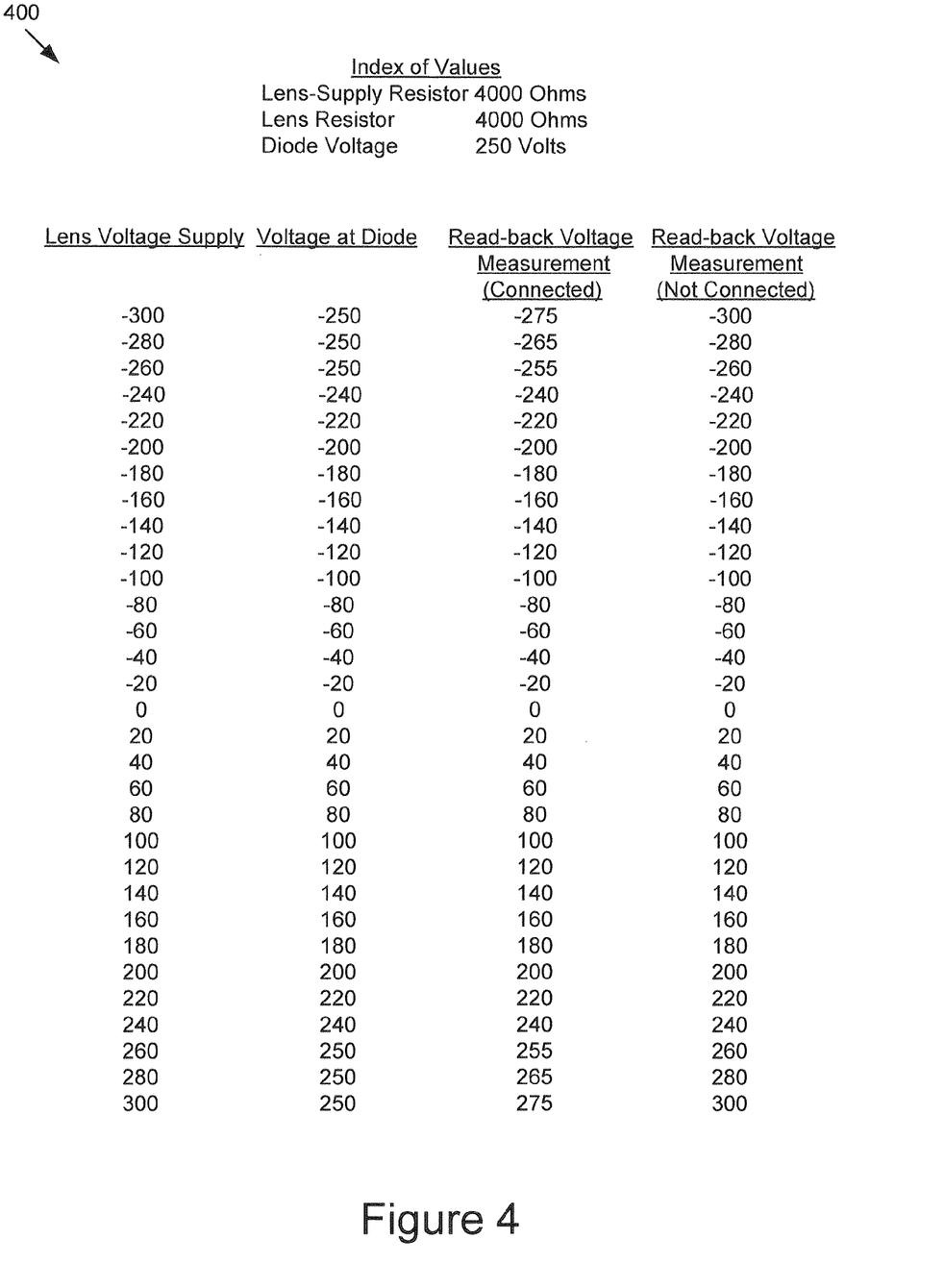
FIG. 4 is a graphical representation illustrating a chart with some example output values to indicate when the read-back circuits indicate whether an ion lens is connected properly versus when it is not properly connected.

FIG. 4 is a graphical representation indicated generally by reference numeral 400, illustrating example outputs from the read-back circuit 208. It should be apparent that these output readings are merely examples and may change. In the implementation for which these example output readings are provided, as indicated by the index of values illustrated in FIG. 4, the resistor 204 has a resistance of 4 k (4,000) ohms, the resistor 214 has a resistance of 4 k (4,000) ohms, and the diode has a voltage of 250 volts. In some implementations, the ion lens voltage supply 202 may be a variable voltage, ranging from −300 to +300 volts. By configuring the test circuit, the voltage at the Zener diodes may fall within a variable voltage range, from −250 to +250 volts. In this example, if the ion lens 212 is properly connected, after the voltage is supplied from the ion lens voltage supply 202, the read-back circuit 208 indicates an approximate reading of −275 volts to 275 volts. In the event the ion lens 212 is not properly connected, after proper application of the voltage from the ion lens voltage supply 202, the read-back circuit 208 indicates an approximate reading between −300 volts to 300 volts.

Figure 5:
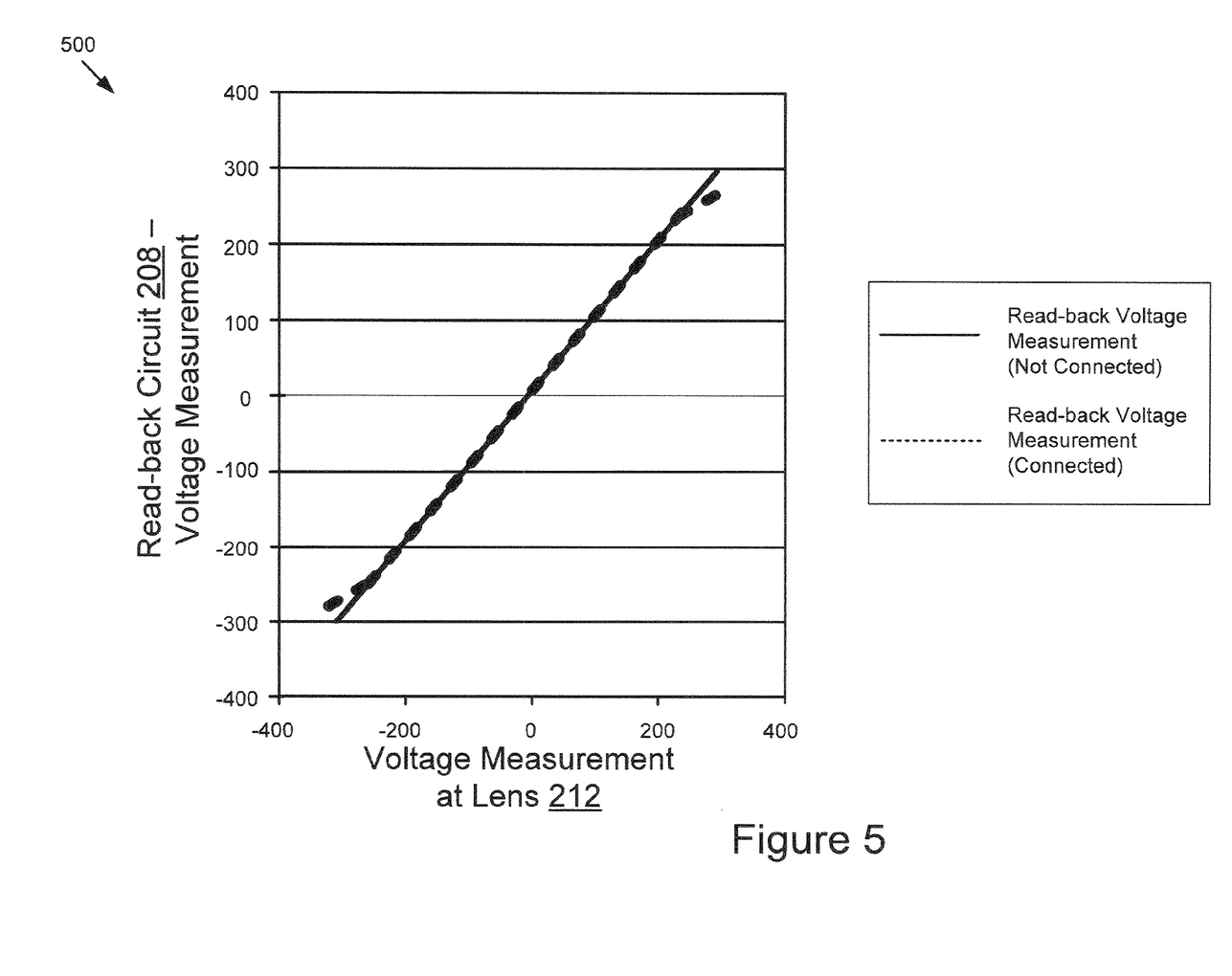
FIG. 5 is a graphical representation of an example graph illustrating example outputs from a read-back circuit configured to detect defects.

FIG. 5 is a graphical representation of a graph illustrated generally by reference numeral 500, illustrating example outputs from the read-back circuit 208. The applied or available reference voltage indicated at 202 is illustrated along the X-axis and example voltage measurements are illustrated along the y-axis. The graph 50 illustrates the readings that reflect when the ion lens 212 is properly connected and not properly connected. The graph 500 illustrates a solid line to indicate the read-back circuit 208 voltage measurements when the ion lens 212 is not connected, and a broken line to indicate the read-back circuit 208 voltage measurement when the ion lens 212 is properly connected. Therefore, the change in slope between the applied voltages (at 202) versus the read-back circuit 208 voltage may be measured and, from the difference in the slope, it may be determined when the ion lens is not properly connected (with no voltage actually reaching the ion lens 212).

The foregoing description of the embodiments of the present technology has been presented for the purposes of illustration and description. It is not intended to be exhaustive or to limit the present technology to the precise form disclosed. Many modifications and variations are possible in light of the above teaching. It is intended that the scope of the present technology be limited not by this detailed description, but rather by the claims of this application. As should be understood by those familiar with the art, the present technology may be embodied in other specific forms, without departing from the spirit or essential characteristics thereof. Likewise, the particular naming and division of the features, attributes, methodologies, and other aspects are not mandatory or significant, and the mechanisms that implement the present disclosure or its features may have different names, divisions and/or formats. Accordingly, the disclosure of the present technology is intended to be illustrative, but not limiting, of the scope of the present disclosure, which is set forth in the following claims.

What is claimed is:

1. An apparatus for monitoring defects or the status of a connection of at least one ion lens disposed within a mass spectrometer, the apparatus comprising:
   an ion lens voltage supply for applying voltage to the at least one ion lens within the mass spectrometer;
   a read-back circuit connected to the at least one ion lens within the mass spectrometer and configured to provide output responses to reflect a first read-back voltage measurement if the at least one ion lens is connected and to reflect a second read-back voltage measurement if the at least one ion lens is not connected; and
   a test circuit including at least one Zener diode configured between the ion lens voltage supply and a reference point, to measure the output responses from the read-back circuit and for indicating a reading of the first read-back voltage measurement reflecting a reduction in voltage when the Zener diode begins conducting, the reading reflecting the reduction in voltage indicating a change in slope of a voltage applied by the ion lens voltage supply versus a voltage at the read-back circuit; wherein the test circuit comprises two Zener diodes, configured back-to-back.

2. An apparatus for monitoring defects according to claim 1, further comprising:
   a first resistor connected between the ion lens voltage supply and the at least one ion lens.

3. An apparatus for monitoring defects according to claim 1, further comprising:
   a second resistor connected between the at least one ion lens and the at least one Zener diode.

4. An apparatus for monitoring defects according to claim 1, further comprising:
   a first resistor connected between the ion lens voltage supply and the at least one ion lens; and
   a second resistor connected between the at least one ion lens and the at least one Zener diode, wherein the test circuit includes two Zener diodes, configured back-to-back and connected between the second resistor and the reference point.

5. An apparatus according to claim 1, wherein the reference point relating to the mass spectrometer is maintained at ground.

6. An apparatus according to claim 1, wherein the reference point is maintained at a designated voltage available within the mass spectrometer.

7. An apparatus for monitoring defects in a connection of at least one ion lens within a mass spectrometer, the apparatus comprising:
   an ion lens voltage supply for applying voltage to the at least one ion lens within the mass spectrometer;
   a first resistor electrically connected to one side of the at least one ion lens, wherein the first resistor limits electrical current to the at least one ion lens;
   a second resistor electrically connected to another side of the at least one ion lens;
   at least one of a Zener diode and another non-linear conduction device is connected between the second resistor and at least one of a ground and a reference voltage supplied by an optional source; and
   a read-back circuit for reading the voltage applied to the at least one ion lens and configured to provide output responses including a first read-back voltage measurement to determine if the at least one ion lens is properly connected within the mass spectrometer and a second read-back voltage measurement if the at least one ion lens is not properly connected within the mass spectrometer; wherein the at least one Zener diode is configured back-to-back with another Zener diode.

8. An apparatus according to claim 7, wherein the read-back circuit observes a change in a slope of voltage at the read-back circuit in relation to the voltage applied by the ion lens voltage supply to reflect the proper connection of the at least one ion lens within the mass spectrometer.

9. An apparatus according to claim 7, wherein a voltage at the read-back circuit is less than the voltage applied by the ion lens voltage supply which indicates the at least one Zener diode or another non-linear conduction device has started conducting electrical current.

10. An apparatus according to claim 5, wherein the read-back circuit is calibrated automatically.

11. A method for monitoring defects in a connection of at least one ion lens within a mass spectrometer, the method comprising:
    applying a voltage from an ion lens voltage supply to the at least one ion lens;
    connecting a Zener diode to a first side of the at least one ion lens and a reference point,
        and applying the voltage across the at least one ion lens and the Zener diode;
    configuring a read-back circuit between the ion lens voltage supply and a second side of the at least one ion lens and monitoring the voltage at the read-back circuit between the ion lens voltage supply and the at least one ion lens to provide output responses to reflect voltage measurements;
    reading the voltage measurements at the read-back circuit in relation to the ion lens voltage supply; and
    determining whether the at least one ion lens is connected based on a change in voltage slope at the read-back circuit in relation to the ion lens voltage supply;
    connecting an additional Zener diode between the first side of the ion lens and the reference point, wherein the Zener diode and the additional Zener diode are configured back-to-back.

12. A method according to claim 11, further comprising:
    connecting a first resistor between the ion lens voltage supply and the second side of the at least one ion lens.

13. A method according to claim 12, further comprising:
    connecting a second resistor between the first side of the ion lens and the reference point.

14. A method according to claim 11, wherein the change in voltage slope reflects a reduction in voltage measured when the Zener diode starts conducting.

15. A method according to claim 11, wherein the reference point is maintained at ground.

16. An apparatus according to claim 11, wherein the reference point is maintained at a designated voltage available within the mass spectrometer.

* * * * *